(12) United States Patent
Tsuruta

(10) Patent No.: US 6,417,503 B1
(45) Date of Patent: Jul. 9, 2002

(54) OPTICAL SENSOR CIRCUIT WITH OUTPUT CHANGING MEANS

(75) Inventor: Yoshio Tsuruta, Nagano (JP)

(73) Assignee: Fuji Electric Co., Ltd., Kawasaki (JP)

( * ) Notice: Subject to any disclaimer, the term of this patent is extended or adjusted under 35 U.S.C. 154(b) by 0 days.

(21) Appl. No.: 09/260,088

(22) Filed: Mar. 2, 1999

(30) Foreign Application Priority Data

Apr. 24, 1998 (JP) .......................................... 10-114984

(51) Int. Cl.[7] ............................................... H01J 40/14
(52) U.S. Cl. ............................ 250/214 A; 250/214 DC; 250/214 LA; 330/308
(58) Field of Search ......................... 250/214 R, 214 A, 250/214 LA, 214 LS, 214 AG, 214 DC, 214 SW, 208.2, 208.4; 330/308, 110, 86; 356/224, 226, 218

(56) References Cited

U.S. PATENT DOCUMENTS

| 4,673,807 A | * | 6/1987 | Kobayashi et al. ... 250/214 AG |
| 5,233,180 A | * | 8/1993 | Tsuruta et al. ............ 250/208.1 |
| 5,387,879 A | * | 2/1995 | Satoh ........................... 330/86 |

FOREIGN PATENT DOCUMENTS

| JP | 62/273420 | 11/1987 |
| JP | 4-1421 | 1/1992 |
| JP | 4-357423 | 12/1992 |
| JP | 5-95238 | 4/1993 |
| JP | 5-40888 | 6/1993 |
| JP | 8-79114 | 3/1996 |

* cited by examiner

Primary Examiner—Kevin Pyo
(74) Attorney, Agent, or Firm—Kanesaka & Takeuchi

(57) ABSTRACT

An optical sensor circuit of the invention includes a photodiode, a reset switch, a capacitor for charge integration, an operational amplifier, reference voltage generating circuits connected to the operational amplifier via switches, and a reference voltage selecting circuit connected to the control input terminals of the respective switches. The reference voltage for defining the upper limit of the output range of the optical sensor circuit can be set at an appropriate value. Since the reference voltage is set at an appropriate value corresponding to the input range of an A/D converter due to this circuit configuration, a conversion error in the A/D converter is avoided, and the analog output of the optical sensor circuit is converted to a digital quantity while the resolution of the A/D converter is fully utilized.

7 Claims, 9 Drawing Sheets

OPTICAL SENSOR CIRCUIT WITH OUTPUT CHANGING MEANS

BACKGROUND OF THE INVENTION AND RELATED ART STATEMENT

The present invention relates to an optical sensor circuit. Specifically, the present invention relates to an optical sensor circuit that outputs an analog signal indicating a light quantity accumulated for a certain period of time as a quantity of change from a reference voltage.

A photoelectric converter that converts an optical signal to an electric signal is used for measuring a light quantity or for reading or obtaining an image. A light-quantity-accumulation-type optical sensor circuit, that utilizes a photoelectric converter, has been known, which outputs data of the light quantity accumulated for a certain period of time as analog data indicating an accumulated light quantity as a quantity of change from a reference voltage.

FIG. 12 is a block circuit diagram of a conventional light-quantity-accumulation-type optical sensor circuit. FIG. 13 is a timing chart explaining the operation of the conventional optical sensor circuit of FIG. 12. Referring now to FIG. 12, the conventional optical sensor circuit includes a photodiode 1, that is a photoelectric converter for converting light to an electric signal, a reset switch 2, a capacitor 3 for accumulating electric charges, and an operational amplifier 4. The cathode of the photodiode 1 is connected to a power supply line. The anode of the photodiode 1 is connected to an inverted input terminal of the operational amplifier 4. The reset switch 2 and the capacitor 3 are connected parallel to each other between the inverted input terminal and the output terminal of the operational amplifier 4 such that an integration circuit is formed. A reference voltage Vref is connected to a non-inverted input terminal of the operational amplifier 4. The output of the operational amplifier 4, i.e. output of the light-quantity-accumulation-type optical sensor circuit, is connected to an analog to digital (A/D) converter 5.

Now, the operation of the optical sensor circuit of FIG. 12 will be explained with reference to FIG. 13. The photodiode 1 is outputting a photo-current i corresponding to the quantity of the light that the photodiode 1 has received to the integration circuit. As the reset switch 2 is switched on at a time to, the output terminal and the inverted input terminal of the operational amplifier 4 are short-circuited. Therefore, the potentials of the output and inverted input terminals of the operational amplifier 4 are identical to the reference voltage Vref. The capacitor 3 is discharged and the quantity of the electric charges accumulated in the capacitor 3 reduces to zero. Then, as the reset switch 2 is switched off at a time t1, the photo-current i generated by the photodiode 1 is accumulated in the capacitor 3. As a result, the output voltage Vout lowers with passage of time. If time after time t1 is indicated as t, the output voltage Vout will be expressed by the following equation (1).

$$V_{out} = V_{ref} - (i \times t/c) \quad (1)$$

Here, c is a capacity of the capacitor 3. That is, the output voltage Vout lowers from the reference voltage Vref in proportion to the light quantity. Therefore, by detecting the output voltage Vout after a certain integration time period, the quantity of light irradiated to the photodiode 1 will be measured. In many cases, the output voltage Vout, that is an analog quantity, is inputted to the A/D converter 5 and converted to a digital quantity to facilitate subsequent data processing by a microprocessor.

As FIG. 13 clearly shows, the maximum value of the output voltage Vout of the optical sensor circuit is Vref. Therefore, the output voltage Vout of the optical sensor circuit varies in the range between the Vref and GND (0 volt). It is preferable that this output range is identical to the input range of the A/D converter 5. When the input range of the A/D converter 5 is narrower than the output range of the optical sensor circuit, the analog value that exceeds the input range is not converted to a correct digital value. When the input range of the A/D converter 5 is wider than the output range of the optical sensor circuit, the resolution of the digital quantity lowers. The A/D converter 5 converts the analog value in its input range to a digital value with a predetermined bit number. When the bit number is same, the pitch for quantization becomes wider as the input range is wider, resulting in low resolution. In other words, the input range of the A/D converter 5 that exceeds the output range of the optical sensor circuit does not contribute to A/D conversion, resulting in low resolution. Due to the foregoing reason, it is desirable that the output range of the optical sensor circuit is adjusted to the input range of the A/D converter 5.

The input range of a specific A/D converter is generally between the reference voltage specific to the A/D converter or the CPU in the subsequent stage and the earth potential GND. Since various A/D converters are used depending on the ways of their use considering the costs and performances, the input ranges of various A/D converters are also various. However, the input range of the conventional optical sensor circuit is fixed between its reference voltage Vref and the earth potential GND. Thus, it is difficult to optimally set the input range and the output range of the conventional optical sensor circuit for the various A/D converters.

In view of the foregoing, it is an object of the invention to provide an optical sensor circuit, wherein the output range of the sensor circuit is adjustable to the input range of the A/D converter disposed in the subsequent stage.

SUMMARY OF THE INVENTION

According to an aspect of the invention, there is provided an optical sensor circuit that outputs an analog signal indicative of a received light quantity. The optical sensor circuit includes: a light detector element for detecting light and for outputting a photo-current indicating the quantity of the detected light; light quantity accumulating means, to which the photo-current is inputted, for accumulating the quantity of the detected light for a certain period of time and for outputting an analog signal indicating the accumulated quantity of the detected light as a quantity of change from a reference voltage; and output range changing means for changing the output range of the analog signal.

Advantageously, the output range changing means includes a plurality of reference voltage generating means for outputting voltages different from each other, and a reference voltage selecting means for selecting one of the outputs of the reference voltage generating means and for feeding the selected output to the light quantity accumulating means as its reference voltage.

Since the above circuit configuration facilitates selecting appropriate one of the reference voltages as the upper limit of the output range, the output range of the optical sensor circuit can be changed to match the input range in the various A/D converters. Since the output range of the optical sensor circuit is matched with the input range of the A/D converters, erroneous conversion in the A/D converter is avoided. And, since the analog light quantity data is converted to digital data fully utilizing the resolution of the A/D converter, the precision of the subsequent digital data processing is improved.

Advantageously, the output range changing means includes an amplifier connected to the output of the light quantity accumulating means, the amplification factor of which is adjustable at an appropriate value.

Since the above circuit configuration facilitates setting the amplification factor of the amplifier at an arbitrary value, the optical sensor circuit is adaptable to various A/D converters with various input ranges.

DETAILED DESCRIPTION OF PREFERRED EMBODIMENTS

Figure 1:
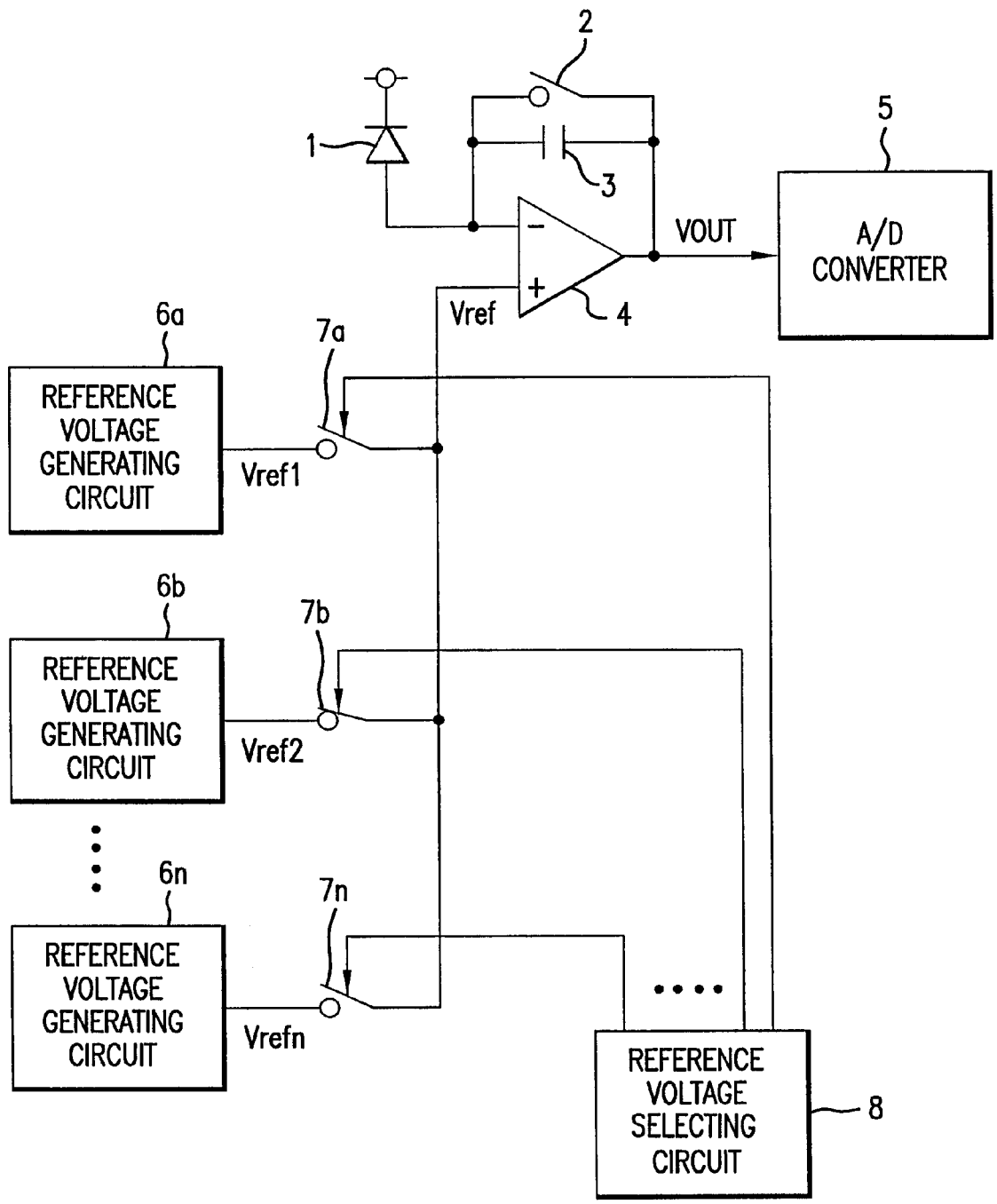
FIG. 1 is a block circuit diagram of an optical sensor circuit according to a first embodiment of the invention.

Now the present invention will be explained hereinafter with reference to accompanied drawings which illustrate the preferred embodiments of the invention. In the drawings, same parts are designated by the same reference numerals and their duplicate explanations are omitted for the sake of simplicity.

FIG. 1 is a block circuit diagram of an optical sensor circuit according to a first embodiment of the invention. Referring now to FIG. 1, the light-quantity-accumulation-type optical sensor circuit includes a photodiode 1, a reset switch 2, a capacitor 3 for charge integration, and an operational amplifier 4. A cathode of the photodiode 1 is connected to a power supply line. An anode of the photodiode 1 is connected to an inverted input terminal of the operational amplifier 4. The reset switch 2 and the capacitor 3 are arranged parallel to each other and are connected between the inverted input terminal and the output terminal of the operational amplifier 4 such that an integration circuit is formed. The output terminal of the operational amplifier 4 works as an output terminal of the optical sensor circuit for connecting its output to an A/D converter 5.

The optical sensor circuit of FIG. 1 further includes reference voltage generating circuits 6a through 6n, switches 7a through 7n, and a reference voltage selecting circuit 8. The reference voltage generating circuits 6a through 6n are connected to a non-inverted input terminal of the operational amplifier 4 via the respective switches 7a through 7n. The reference voltage selecting circuit 8 is connected to the respective switches 7a through 7n to output control signals for turning on and off of the switches 7a through 7n. The reference voltage generating circuits 6a through 6n, the switches 7a through 7n and the reference voltage selecting circuit 8 constitute output range changing means.

The reference voltage generating circuits 6a through 6n output respective reference voltages Vref1 through Vrefn, that are different from one another. The reference voltage selecting circuit 8 selects either one of the switches 7a through 7n. Therefore, either one of the reference voltage generating circuits 6a through 6n is selected, so that a desired reference voltage is inputted to the non-inverted input terminal of the operational amplifier 4.

For example, when the switch 7b is selected by the reference voltage selecting circuit 8 as shown in FIG. 1, the reference voltage Vref2 that the reference voltage generating circuit 6b generates is fed to the non-inverted input terminal of the operational amplifier 4. Due to this circuit connection, the output voltage Vout of the operational amplifier 4 is equal to Vref2 when the reset witch 2 is ON. When the selected reference voltage Vref2 is almost equal to the maximum value in the allowable analog input range of the A/D conversion, the output of the sensor circuit is efficiently transmitted to the A/D converter 5.

Figure 2:
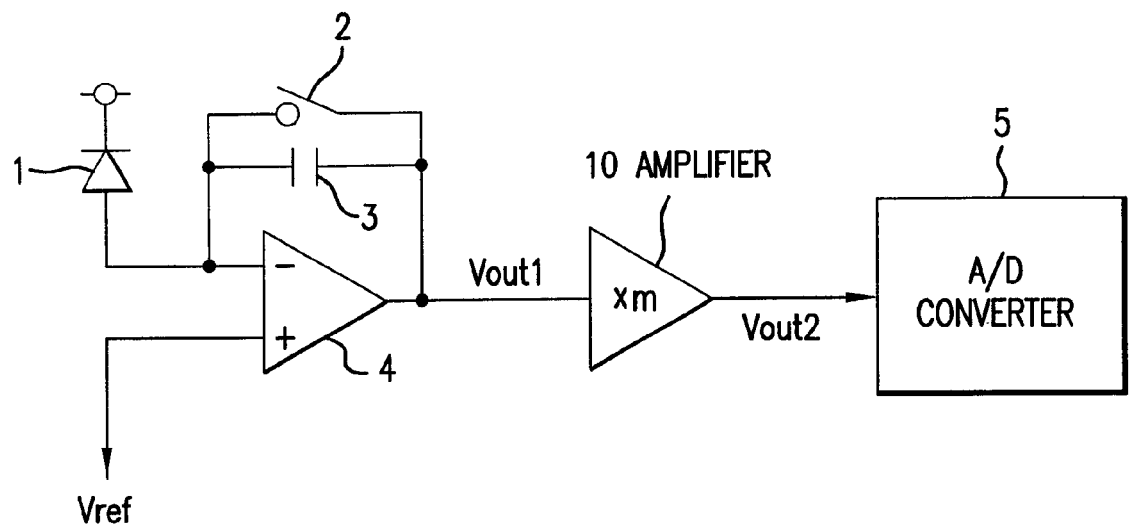
FIG. 2 is a block circuit diagram of an optical sensor circuit according to a second embodiment of the invention.
Figure 3:
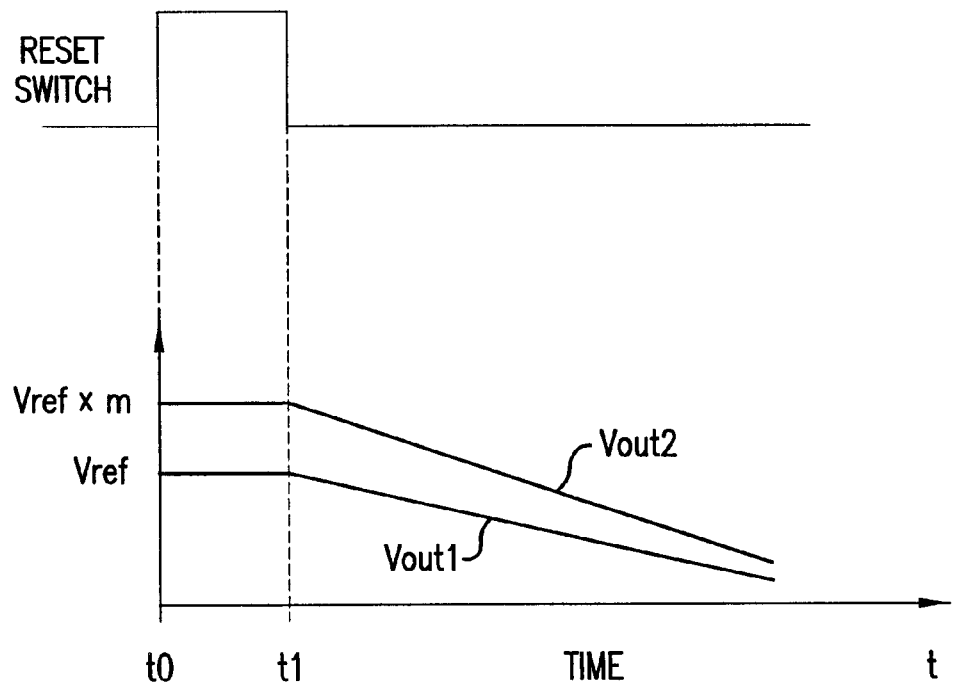
FIG. 3 is a timing chart explaining an operation of the optical sensor circuit of FIG. 2.

FIG. 2 is a block circuit diagram of an optical sensor circuit according to a second embodiment of the invention. FIG. 3 is a timing chart explaining the operation of the optical sensor circuit of FIG. 2. Referring now to FIG. 2, an amplifier 10, the amplification factor of which is m, is disposed in the subsequent stage of the operational amplifier 4. The amplification factor m is not fixed. The amplification factor m may take an appropriate value. The sensor circuit of FIG. 2 outputs a voltage Vout2, obtained by multiplying the output voltage Vout1 of the operational amplifier 4 and m, to an A/D converter 5. The amplifier 10, the amplification factor of which is adjustable to an appropriate value, constitutes output range changing means.

FIG. 3 shows the changes of the output voltage Vout1 of the operational amplifier 4 and the output voltage Vout2 outputted from the amplifier 10. In case the output range of the voltage Vout1 from the operational amplifier 4 is between Vref and 0 V, since the output voltage Vout2 of the amplifier 10 is Vout1×m, the output range of the voltage Vout2 is between Vref× m and 0 V. By setting m at an appropriate value, the output range of the optical sensor circuit of FIG. 2 is matched with the input range of the A/D converter.

Figure 4:
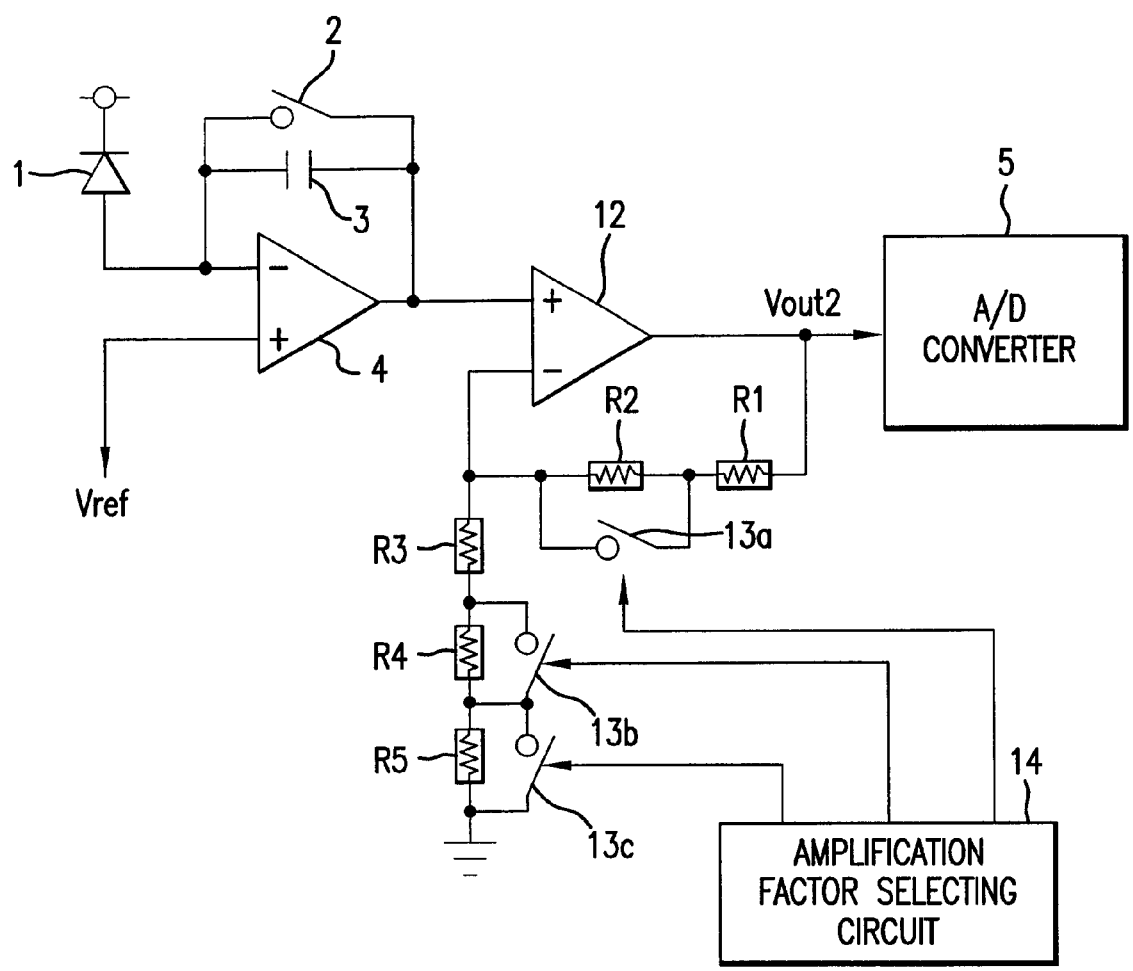
FIG. 4 is a block circuit diagram of an optical sensor circuit according to a third embodiment of the invention.

FIG. 4 is a block circuit diagram of an optical sensor circuit according to a third embodiment of the invention. Referring now to FIG. 4, an operational amplifier 12 is disposed in the subsequent stage of the operational amplifier 4. The output of the operational amplifier 4 is connected to a non-inverted input terminal of the operational amplifier 12. The output terminal of the operational amplifier 12 works as an output terminal of the optical sensor circuit connected to an A/D converter 5. Two feedback resistors R1 and R2 are connected in series between the output terminal and the inverted terminal of the operational amplifier 12, and earth resistors R3, R4 and R5 are connected in series to each other between an inverted terminal of the operational amplifier 12 and the ground GND such that a non-inverted-input-type amplifier is formed. Switches 13a, 13b and 13c. are connected parallel to the respective resistors R3, R4 and R5. An amplification factor selecting circuit 14 is connected to the control input terminals of the switches 13a, 13b and 13c for turning on and off of the switches 13a, 13b and 13c.

The amplification factor m of the operational amplifier 12 is expressed by the following equation (2) with the feedback resistance Rf and the earth resistance Rs.

$$m=1+Rf/Rs \qquad (2)$$

Since three switches are disposed for the feedback resistance Rf and the earth resistance Rs, eight amplification factors can be set. The maximum amplification factor is 1+(R1+R2)/R3 and the minimum amplification factor is 1+R1/(R3+R4+R5).

Figure 5:
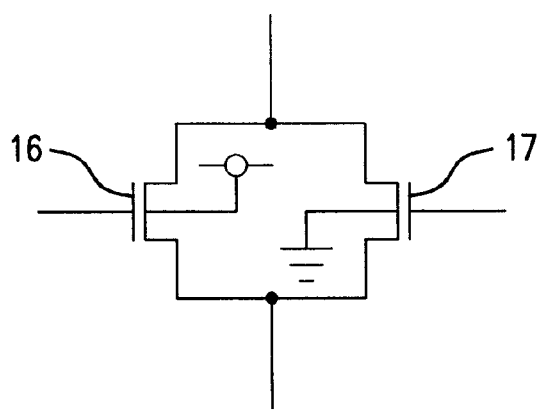
FIG. 5 shows a structural example of the switch of FIG. 4.

FIG. 5 shows a structural example of the switch of FIG. 4. Referring now to FIG. 5, the switch 13a, 13b or 13c for selecting appropriate amplification factors includes a P-type field effect transistor 16 and an N-type field effect transistor 17 combined as illustrated. This is because due to the nature of the field effect transistor, one single field effect transistor does not work as a switch, through which an input signal is conductive, when the potential of the input signal is around the earth potential or around the power supply voltage.

More in detail, the P-type field effect transistor 16 works as a switch for transmitting the input signal when the potential of the input signal is between a threshold voltage Vth of the P-type field effect transistor and the power supply voltage. The N-type field effect transistor 17 works as a switch for transmitting the input signal when the potential of the input signal is between the earth potential GND and the voltage value obtained by subtracting the threshold voltage Vth of the N-type field effect transistor from the power supply voltage. Therefore, the field effect transistors 16 and 17 combined as described in FIG. 5 work in a complementary manner to each other as a switch over the entire range between the earth potential and the power supply voltage.

To obtain a switch that works over the entire range between the earth potential and the power supply voltage, two types of field effect transistors, i.e. P-type field effect transistor 16 and N-type field effect transistor 17, are necessary. Since the P-type field effect transistor 16 and the N-type field effect transistor 17 are used, the amplification factor selecting circuit 14 feeds gate signals, opposite in phase to each other, to the respective field effect transistors 16 and 17 for controlling their switching on and off.

Figure 6:
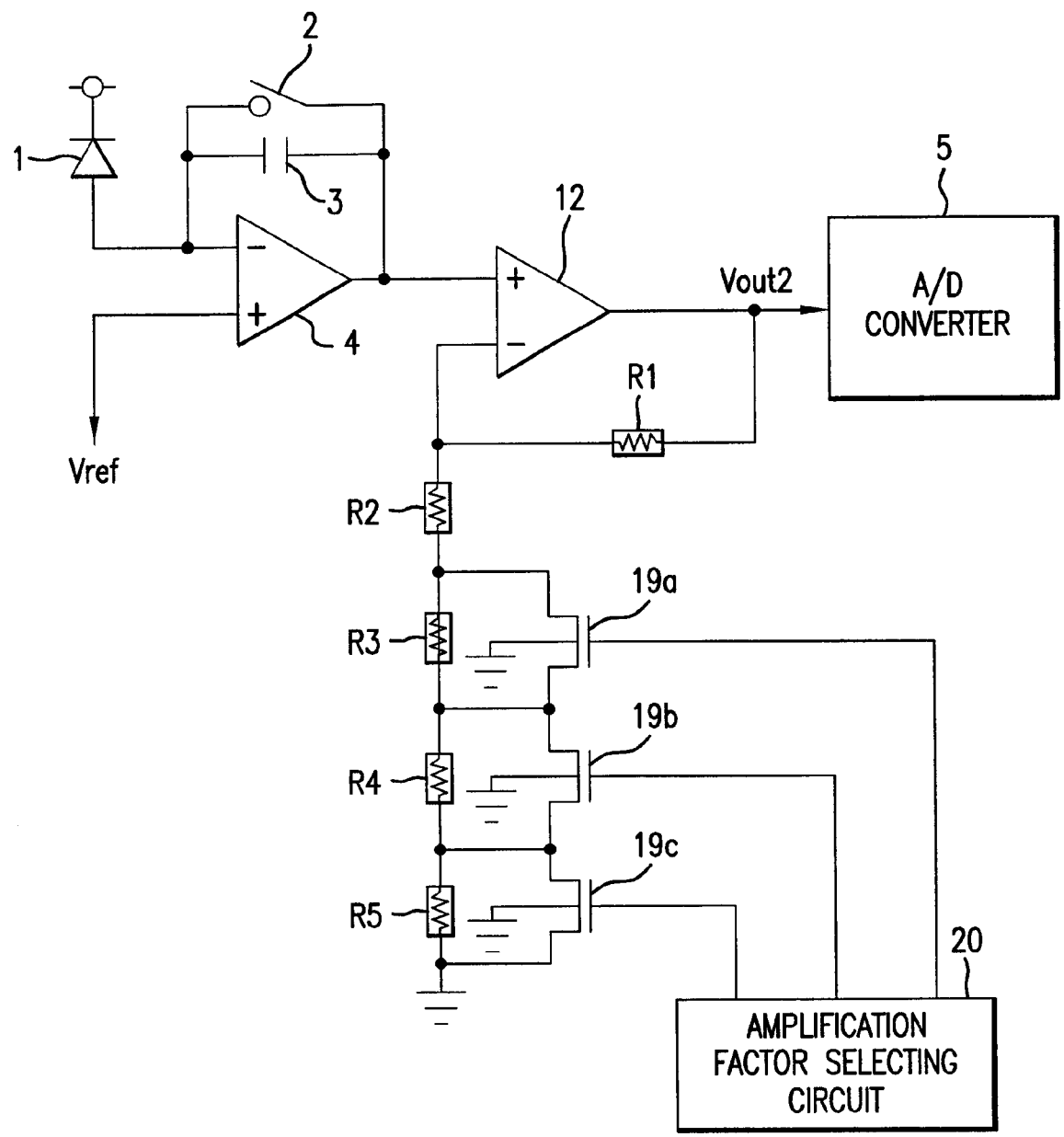
FIG. 6 is a block circuit diagram of an optical sensor circuit according to a fourth embodiment of the invention.

FIG. 6 is a block circuit diagram of an optical sensor circuit according to a fourth embodiment of the invention. Referring now to FIG. 6, one resistor R1 is used for the feedback resistance and four resistors R2, R3, R4 and R5 are used for the earth resistance. The resistors R2, R3, R4 and R5 are connected in series. N-type field effect transistors 19a, 19b and 19c are arranged with their drains and sources connected to both ends of the respective resistors R3, R4 and R5. The gates of the field effect transistors 19a, 19b and 19c are connected to an amplification factor selecting circuit 20. The optical sensor circuit of FIG. 6 has characteristics such that the switches for changing the amplification factors are all N-type field effect transistors, and are arranged only on the earth resistance side. The earth resistances and the switches are arranged between the inverted input terminal of the operational amplifier 12 and the ground GND, so that the signal potential can be suppressed at a low value, which allows the switches to be constituted only by N-type field effect transistors. In the optical sensor circuit of FIG. 6, the potential Vsd between the source and drain of the N-type field effect transistor is expressed by the following equation (3).

$$Vsd=Vref\times(R3+R4+R5)/(R2+R3+R4+R5) \qquad (3)$$

The circuit configuration of FIG. 6 facilitates halving the number of the transistors and the circuit area in comparison to the circuit configuration of FIG. 4 that uses P- and N-type field effect transistors for constituting the switch. The circuit configuration of FIG. 6 needs only one gate signal line for controlling the switch. Thus, the circuit configuration of FIG. 6 facilitates reducing the costs of the optical sensor circuit.

Figure 7:
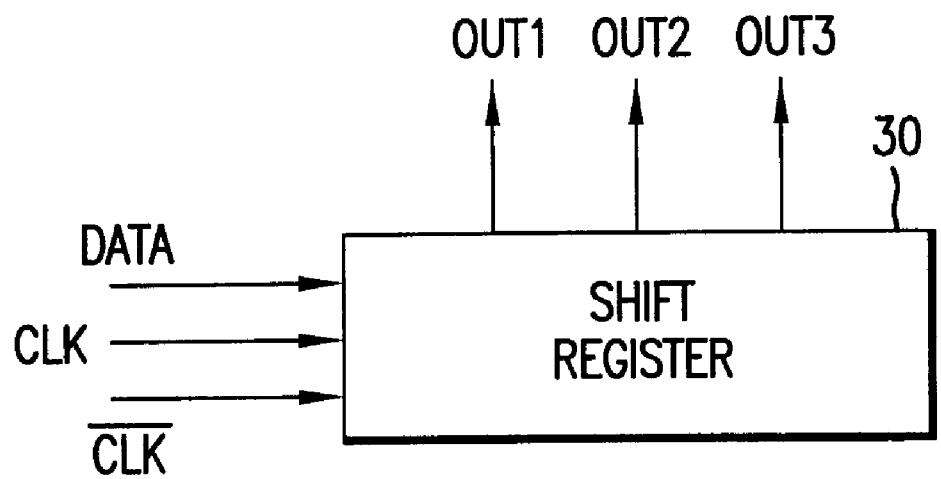
FIG. 7 shows an example of a structure of an amplification factor selecting circuit.
Figure 8:
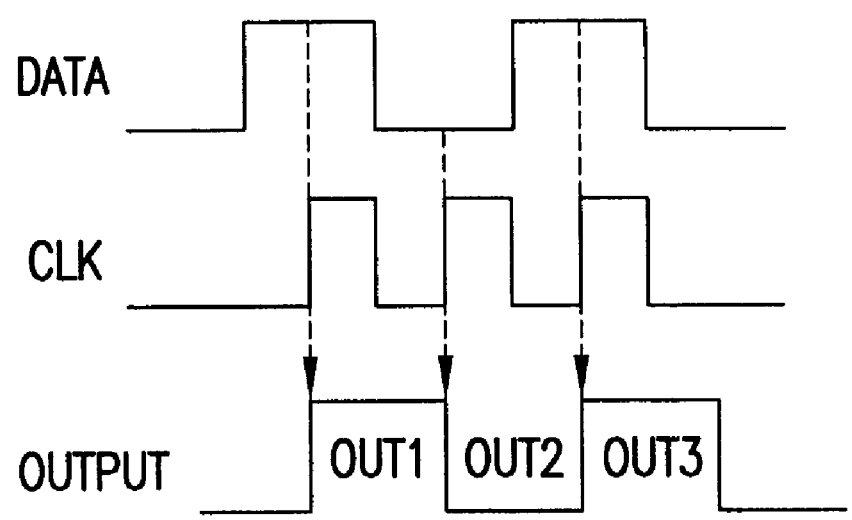
FIG. 8 is a timing chart explaining the operation of the amplification factor selecting circuit of FIG. 7.

FIG. 7 shows an example of the structure of the amplification factor selecting circuit. FIG. 8 is a timing chart explaining the operation of the amplification factor selecting circuit of FIG. 7. Referring now to FIG. 7, the amplification factor selecting circuit includes a shift register 30. The shift register 30 includes a three stage register, a data input portion DATA, a clock input portion Clk, an inverted clock input portion Clk and three output portions OUT1, OUT2 and OUT3. The output portions OUT1, OUT2 and OUT3 are connected respectively to the gates of the N-type field effect transistors 19a, 19b and 19c, for example, working as the switches in FIG. 6.

In FIG. 7, serial data including "1" and "0" indicative of ON or OFF of each switch is inputted to the data input portion DATA and a clock signal to the clock input portion Clk. In response to this, gate signals, each indicating ON or OFF of each of the switches, are outputted from the output portions OUT1, OUT2 and OUT3 to control the ON and OFF of the N-type field effect transistors 19a, 19b and 19c.

For example, to switch the N-type field effect transistor 19a on, the N-type field effect transistor 19b off and the N-type field effect transistor 19c on, serial data "101" indicating ON and OFF of the transistors 19a, 19b and 19c is inputted to the data input portion DATA of the shift register 30 as shown in FIG. 8. The serial data shifts in synchronism with the clock signal inputted to the clock input portion Clk. By stopping the input of the clock signal after the serial data for the number of the switches has shifted, the parallel data "101" is outputted to the output portions OUT1, OUT2 and OUT3. As a result, the N-type field effect transistors 19a and 19c are switched on and the N-type field effect transistor 19b is switched off, so that the earth resistance may be R2+R4 and an amplification factor corresponding to the earth resistance R2+R4 may be selected.

Figure 9:
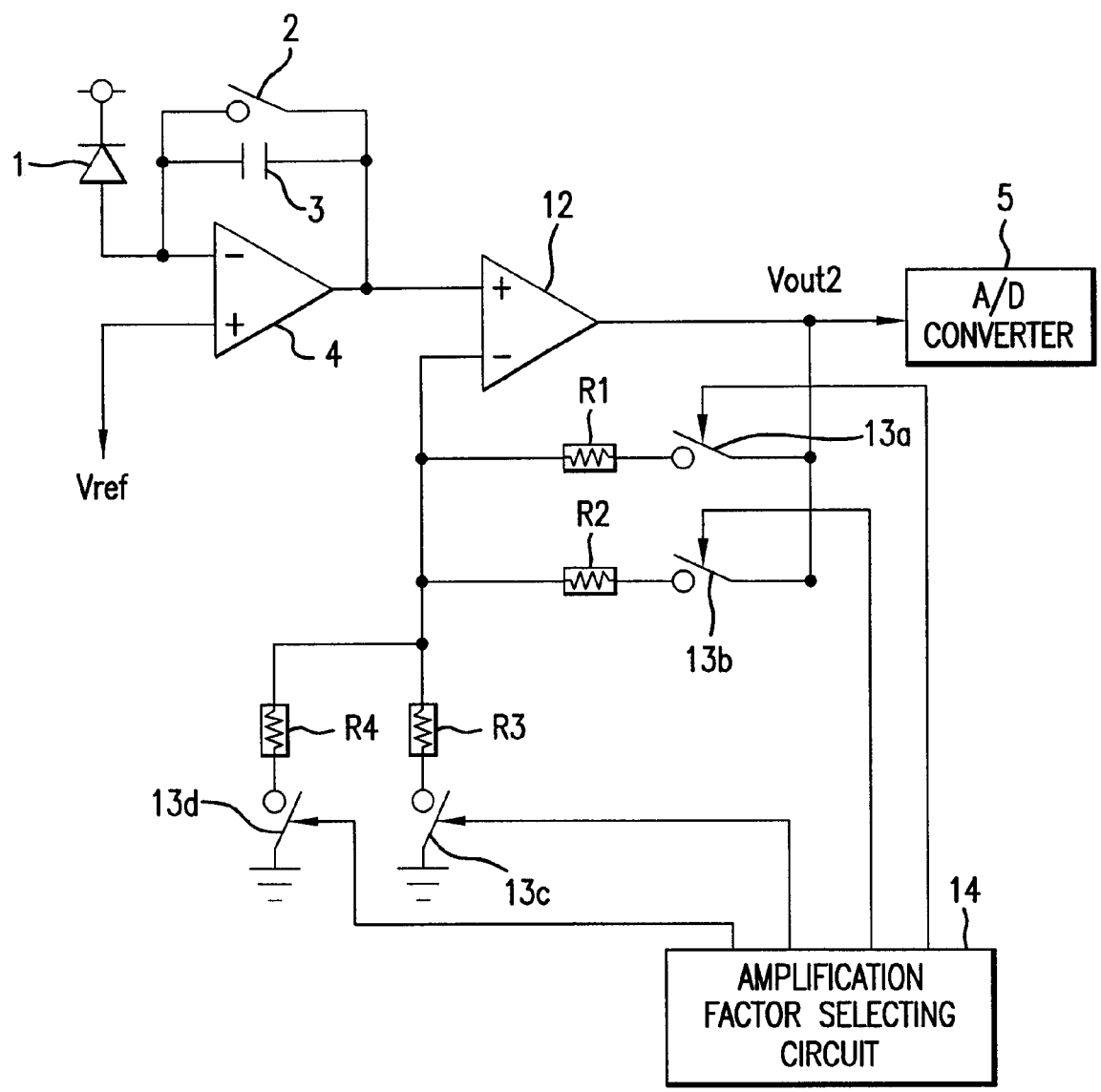
FIG. 9 is a block circuit diagram of an optical sensor circuit according to a fifth embodiment of the invention.

FIG. 9 is a block circuit diagram of an optical sensor circuit according to a fifth embodiment of the invention. Referring now to FIG. 9, the feedback resistance includes two resistors R1 and R2 connected parallel to each other. Switches 13a and 13b are connected in series to the resistors R1 and R2, respectively. The earth resistance includes two resistors R3 and R4 connected parallel to each other. Switches 13c and 13d are connected in series to the resistors R3 and R4, respectively. The control terminals of the switches 13a, 13b, 13c and 13d are connected to an amplification factor selecting circuit 14. The switch that includes a P-type field effect transistor and an N-type field effect transistor combined as shown in FIG. 5 is used for the switches 13a, 13b, 13c and 13d. Or, the switches 13c and 13d may include the N-type field effect transistor only.

An appropriate amplification factor is selected by adjusting the feedback and earth resistance values. The feedback and earth resistance values are adjusted by appropriately combining ON and OFF of the switches 13a, 13b, 13c and 13d.

Figure 10:
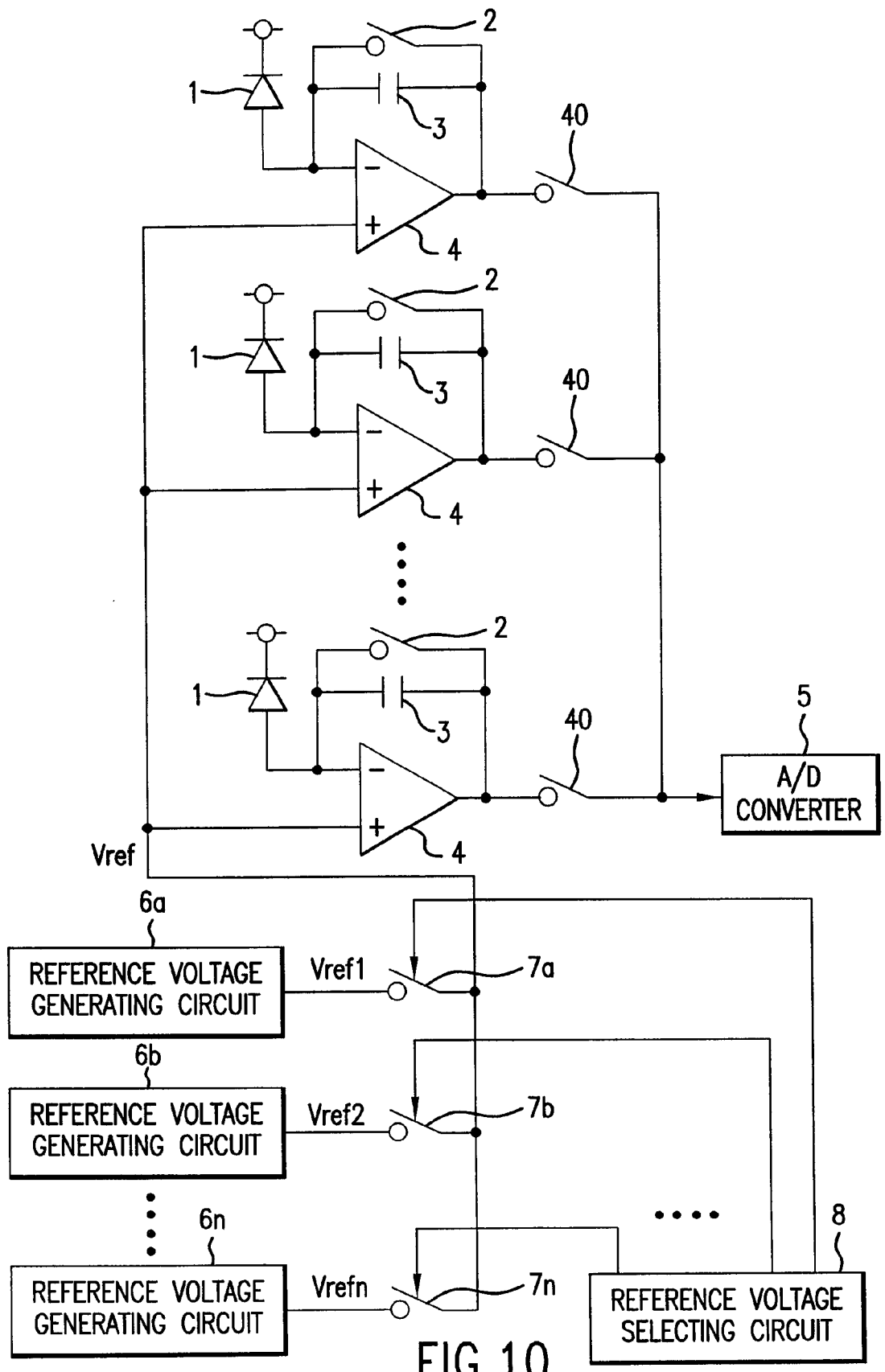
FIG. 10 is a block circuit diagram of an optical sensor circuit including an array of light detector elements according to a sixth embodiment of the invention.

FIG. 10 is a block circuit diagram of an optical sensor circuit including an array of light detector elements according to a sixth embodiment of the invention. Referring now to FIG. 10, the optical sensor circuit includes a plurality of light quantity accumulating circuits connected in parallel. Each of the light quantity accumulating circuits includes a photodiode 1, a reset switch 2, a capacitor 3 for charge integration, and an operational amplifier 4. The photodiodes 1, i.e. light detector elements, are aligned in an array such that a line sensor is formed. The output of each operational amplifier 4 is connected to an A/D converter via a switch 40. Reference voltage generating circuits 6a through 6n for setting a plurality of reference voltage values, switches 7a through 7n and a reference voltage selecting circuit 8 are connected to the non-inverted input terminals of the operational amplifiers 4 so that one of the reference voltage values may be inputted to the non-inverted input terminals of the operational amplifiers 4. Namely, in the photodiodes aligned in an array, one set of reference voltage generating circuits that can set a plurality of reference voltage values is enough to change the output ranges of a plurality of light quantity accumulating circuits.

In the light quantity accumulating circuits, by switching on and off the reset switches 2 one by one and by switching the switches 40 on one by one after a certain time period has elapsed from the switching off for the respective reset switches, the optical signals that the photodiodes 1 have received are fed to the A/D converter 5 one by one.

Figure 11:
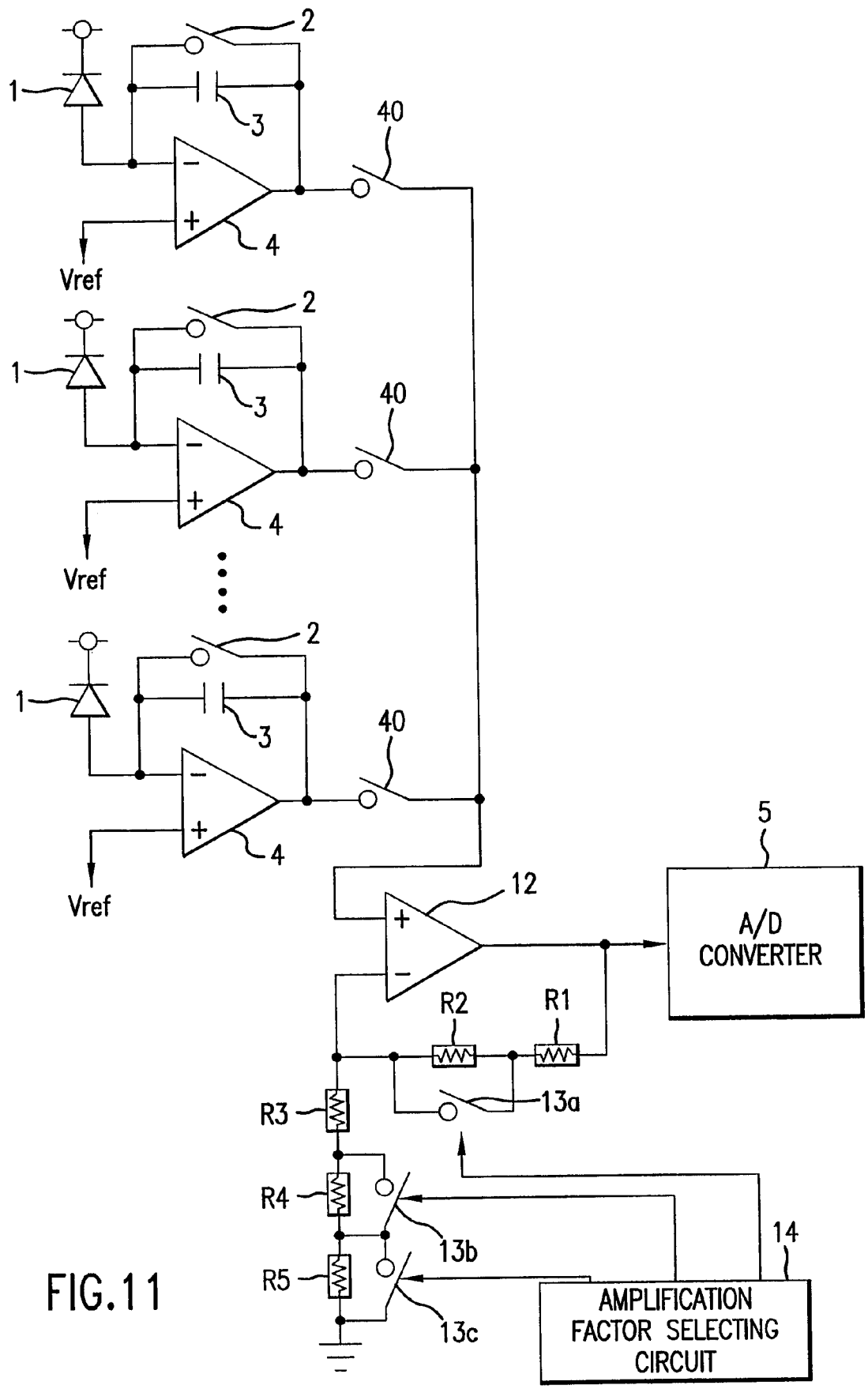
FIG. 11 is a block circuit diagram of an optical sensor circuit including an array of light detector elements according to a seventh embodiment of the invention.
Figure 12:
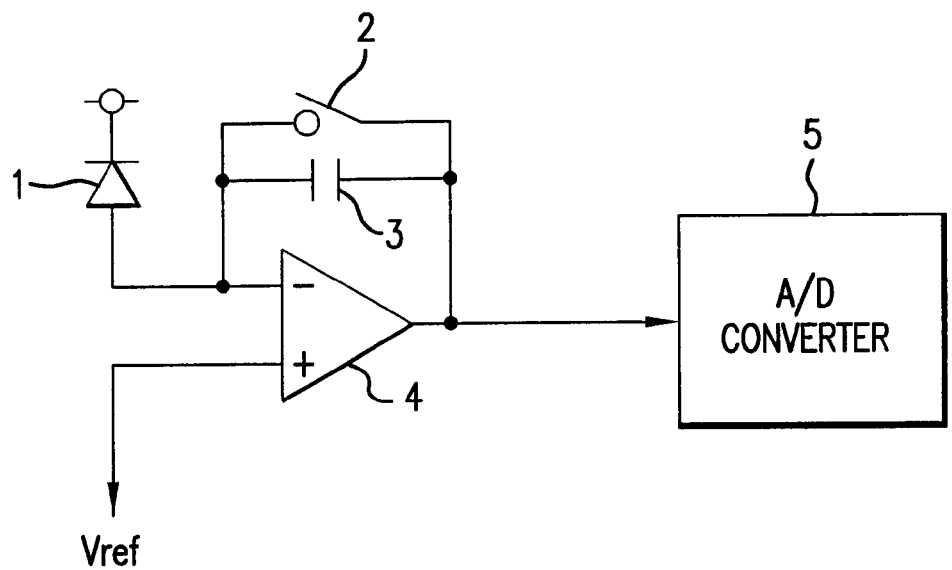
FIG. 12 is a block circuit diagram of a conventional light-quantity-accumulation-type optical sensor circuit.
Figure 13:
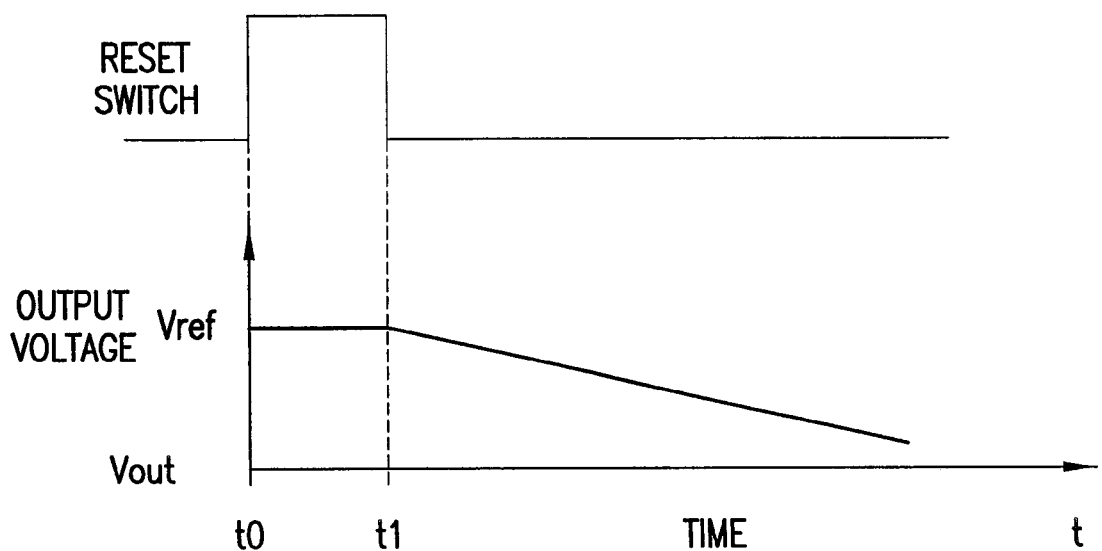
FIG. 13 is a timing chart explaining an operation of the conventional optical sensor circuit of FIG. 12.

FIG. 11 is a block circuit diagram of an optical sensor circuit including an array of light detector elements according to a seventh embodiment of the invention. Referring now to FIG. 11, the optical sensor circuit includes a plurality of light quantity accumulating circuits connected in parallel. Photodiodes 1 of the light quantity accumulating circuits are aligned in an array such that a line sensor is formed. The output of each operational amplifier 4 is connected via a switch 40 to an operational amplifier 12, the amplification factor of which can be set at an appropriate value. Although it is necessary to dispose one integration circuit for each of the photodiodes aligned in an array, one operational amplifier 12, the amplification factor of which can be set at an appropriate value, is enough to change the output ranges of the light quantity accumulating circuits.

By switching on and off the reset switches 2 one by one and by switching the switches 40 on in synchronism with the operations of the corresponding reset switches, the output voltages indicating the light quantities that the respective photodiodes 1 have received are normalized by the operational amplifier 12 and fed to the A/D converter 5.

In the foregoing embodiments that disclose the most fundamental circuit configurations, an amplifier, the amplification factor of which is fixed, may be disposed between the integration circuit in the initial stage and the amplifier in the subsequent stage or after the amplifier in the subsequent stage.

In the sixth and seventh embodiments in FIGS. 10 and 11, the output of each light quantity accumulating circuit may be connected to a sample hold circuit. In this case, the reset switches of the light quantity accumulating circuits are switched on and off simultaneously. The sample hold circuits sample and hold the outputs of the respective light quantity accumulating circuits after a certain period of time has elapsed from the switching off for the reset switch. Then, the switches 40, are switched on one by one, so that the outputs of the light quantity accumulating circuits, i. e. outputs of the sample hold circuits, are fed in series to the A/D converter 5 one by one.

According to the invention, the optical sensor circuit is formed such that the reference voltage Vref that defines the upper limit of the output range of the optical sensor circuit can be set at an appropriate value. Or, the optical sensor circuit according to the invention includes an operational amplifier at the last stage, the amplification factor of which can be set at an appropriate value, for setting an appropriate output range for the optical sensor circuit. Since the circuit configurations according to the invention facilitate selecting an appropriate reference voltage to correspond to various input ranges of the various A/D converters, conversion error in the A/D converter is avoided. Since the resolution of the A/D converter is fully utilized for converting an analog signal to digital data, the precision for the subsequent digital data processing is improved.

What is claimed is:

1. An optical sensor circuit for outputting an analog signal indicating a quantity of received light to an A/D converter, comprising:

a light detector element for detecting light and outputting a photo-current indicating a quantity of the detected light;

light quantity accumulating means connected to the light detector element for receiving the photo-current, said light quantity accumulating means accumulating the photo-current for a predetermined period of time and outputting an analog signal indicating an accumulated quantity of the detected light as a quantity of change with respect to a reference voltage; and output range changing means connected to an input of the light quantity accumulating means, said output range changing means changing an output range of the analog signal outputted from the light quantity accumulating means according to an input range of the A/D converter, said output range changing means including a plurality of reference voltage generating means outputting voltages different from each other, and reference voltage selecting means selecting one of outputs of the reference voltage generating means, said reference voltage selecting means feeding the selected output to the light quantity accumulating means as the reference voltage thereof so that an output range of the sensor circuit is adjusted to accord the input range of the A/D converter.

2. An optical sensor circuit according to claim 1, wherein said reference voltage selecting means selects one of the outputs from the reference voltage generating means in response to a signal from outside.

3. An optical sensor circuit for outputting an analog signal indicating a quantity of received light to an A/D converter, comprising:

a plurality of light detector elements aligned in an array, each light detector element detecting light and outputting a photo-current indicating a quantity of the detected light;

a plurality of light quantity accumulating circuits connected to the respective light detector elements for receiving the photo-currents, each light quantity accumulating circuit accumulating the photo-current for a predetermined period of time and outputting an analog signal indicating an accumulated quantity of the detected light as a quantity of change with respect to a reference voltage;

a plurality of reference voltage generating circuits for outputting reference voltages different from each other; and a reference voltage selecting circuit selecting one of the reference voltages and feeding the selected reference voltage to all inputs of the light quantity accumulating circuits as the reference voltage thereof so that an output range of the sensor circuit is adjusted to accord an input range of the A/D converter.

4. An optical sensor circuit according to claim 1, wherein said light quantity accumulating circuit includes a capacitor and an operational amplifier arranged parallel to the capacitor and connected between an input and an output of the capacitor, said reference voltage selecting means feeding the selected output to the operational amplifier as the reference voltage.

5. An optical sensor circuit according to claim 1, wherein said light detector element outputs the photo-current (i), and said light quantity accumulating means outputs a difference (Vref−i×t/C) between a voltage (i×t/C) generated based on a charge (C) accumulated for the predetermined period of time (t) and the reference voltage (Vref).

6. An optical sensor circuit according to claim 3, wherein said light quantity accumulating circuit includes a capacitor and an operational amplifier arranged parallel to the capacitor and connected between an input and an output of the capacitor, said reference voltage selecting means feeding the selected output to the operational amplifier as the reference voltage.

7. An optical sensor circuit according to claim 3, wherein said light detector element outputs the photo-current (i), and said light quantity accumulating means outputs a difference (Vref−i×t/C) between a voltage (i×t/C) generated based on a charge (C) accumulated for the predetermined period of time (t) and the reference voltage (Vref).

* * * * *